United States Patent
Kaplenko et al.

(10) Patent No.: US 11,703,468 B2
(45) Date of Patent: Jul. 18, 2023

(54) METHOD AND SYSTEM FOR DETERMINING SAMPLE COMPOSITION FROM SPECTRAL DATA

(71) Applicant: FEI Company, Hillsboro, OR (US)

(72) Inventors: Oleksii Kaplenko, Brno (CZ); Jan Klusáček, Brno (CZ); Tomáš Tůma, Brno (CZ); Mykola Kaplenko, Brno (CZ); Ondřej Machek, Brno (CZ)

(73) Assignee: FEI Company, Hillsboro, OR (US)

( * ) Notice: Subject to any disclaimer, the term of this patent is extended or adjusted under 35 U.S.C. 154(b) by 56 days.

(21) Appl. No.: 17/365,832

(22) Filed: Jul. 1, 2021

(65) Prior Publication Data

US 2023/0003675 A1    Jan. 5, 2023

(51) Int. Cl.
| | |
|---|---|
| *G01N 23/2252* | (2018.01) |
| *G01N 23/20* | (2018.01) |
| *G01N 23/203* | (2006.01) |
| *G01N 23/04* | (2018.01) |
| *G06N 3/02* | (2006.01) |
| *G01N 23/083* | (2018.01) |
| *H01J 37/28* | (2006.01) |

(52) U.S. Cl.
CPC ......... *G01N 23/2252* (2013.01); *G01N 23/04* (2013.01); *G01N 23/083* (2013.01); *G01N 23/203* (2013.01); *G01N 23/20083* (2013.01); *G06N 3/02* (2013.01); *G01N 2223/072* (2013.01); *H01J 37/28* (2013.01); *H01J 2237/2807* (2013.01)

(58) Field of Classification Search
CPC .. G01N 23/2252; G01N 23/04; G01N 23/083; G01N 23/20083; G01N 23/203; G01N 2223/072; G06N 3/02; H01J 37/28; H01J 2237/2807
See application file for complete search history.

(56) References Cited

U.S. PATENT DOCUMENTS

| | | | |
|---|---|---|---|
| 3,281,265 A * | 10/1966 | Cauley | C23C 14/562 427/595 |
| 10,539,517 B2 * | 1/2020 | Kashu | G01N 23/083 |
| 2020/0034956 A1 * | 1/2020 | Machek | G06T 7/001 |
| 2020/0363349 A1 * | 11/2020 | Klusácek | G01N 23/2252 |
| 2020/0408514 A1 * | 12/2020 | Heil | G01B 21/042 |
| 2021/0104375 A1 * | 4/2021 | Geurts | H01J 37/20 |
| 2022/0037111 A1 * | 2/2022 | Kaplenko | H01J 37/265 |
| 2022/0065804 A1 * | 3/2022 | Kaplenko | G01N 23/2204 |
| 2022/0208508 A1 * | 6/2022 | Kaplenko | G06N 3/0454 |

FOREIGN PATENT DOCUMENTS

| | | |
|---|---|---|
| EP | 3734260 | 11/2020 |
| EP | 3736849 | 11/2020 |
| EP | 3745442 | 12/2020 |

* cited by examiner

*Primary Examiner* — David A Vanore

(57) ABSTRACT

Method and system are disclosed for determining sample composition from spectral data acquired by a charged particle microscopy system. Chemical elements in a sample are identified by processing the spectral data with a trained neural network (NN). If the identified chemical elements not matching with a known elemental composition of the sample, the trained NN is retrained with the spectral data and the known elemental composition of the sample. The retrained NN can then be used to identify chemical elements within other samples.

24 Claims, 6 Drawing Sheets

1

METHOD AND SYSTEM FOR DETERMINING SAMPLE COMPOSITION FROM SPECTRAL DATA

FIELD OF THE INVENTION

The present description relates generally to methods and systems for determining sample composition from spectral data, and more particularly, for determining the sample composition based on spectral data acquired responsive to irradiating the sample with a charged particle beam.

BACKGROUND OF THE INVENTION

Charged particle microscopy is a well-known and increasingly important technique for imaging microscopic objects. Multiple types of emissions from a sample responsive to charged particle irradiation may provide structural and compositional information of the sample. For example, based on energy spectrum of an X-ray emission responsive to electron beam irradiation, energy-dispersive X-ray spectroscopy (EDS or EDX) can be used for elemental analysis or chemical characterization.

One method for determining the chemical elements in the sample is to compare each detected energy spectrum with known spectra of chemical elements. For example, chemical elements may be identified by comparing peak locations in the detected spectrum with known peak locations of each chemical element. However, Applicant recognizes that the identified chemical elements may include a large number of false positives and/or false negatives, especially when the detected spectrum is sparse or have interfering peaks.

SUMMARY

In one embodiment, a method comprises irradiating a first sample with a charged particle beam; detecting a first type emission from the first sample and forming one or more first spectra from the detected first type emission; identifying one or more first chemical elements within the first sample by processing the first spectra with a trained neural network; detecting a second type emission from the first sample and displaying a sample image generated based on the detected second type emission; selecting one or more pixels in the sample image; displaying one or more chemical elements corresponding to the selected pixels; responsive to the displayed chemical elements different from a known elemental composition, retraining the trained neural network with spectra corresponding to the selected pixels and the known elemental composition; irradiating one or more locations of a second sample with the charged particle beam; acquiring one or more second spectra by detecting the first type emission from the second sample; and identifying one or more second chemical elements within the second sample by processing the second spectra with the retrained neural network. In this way, chemical elements may be quickly identified with high accuracy.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

Figure 1:
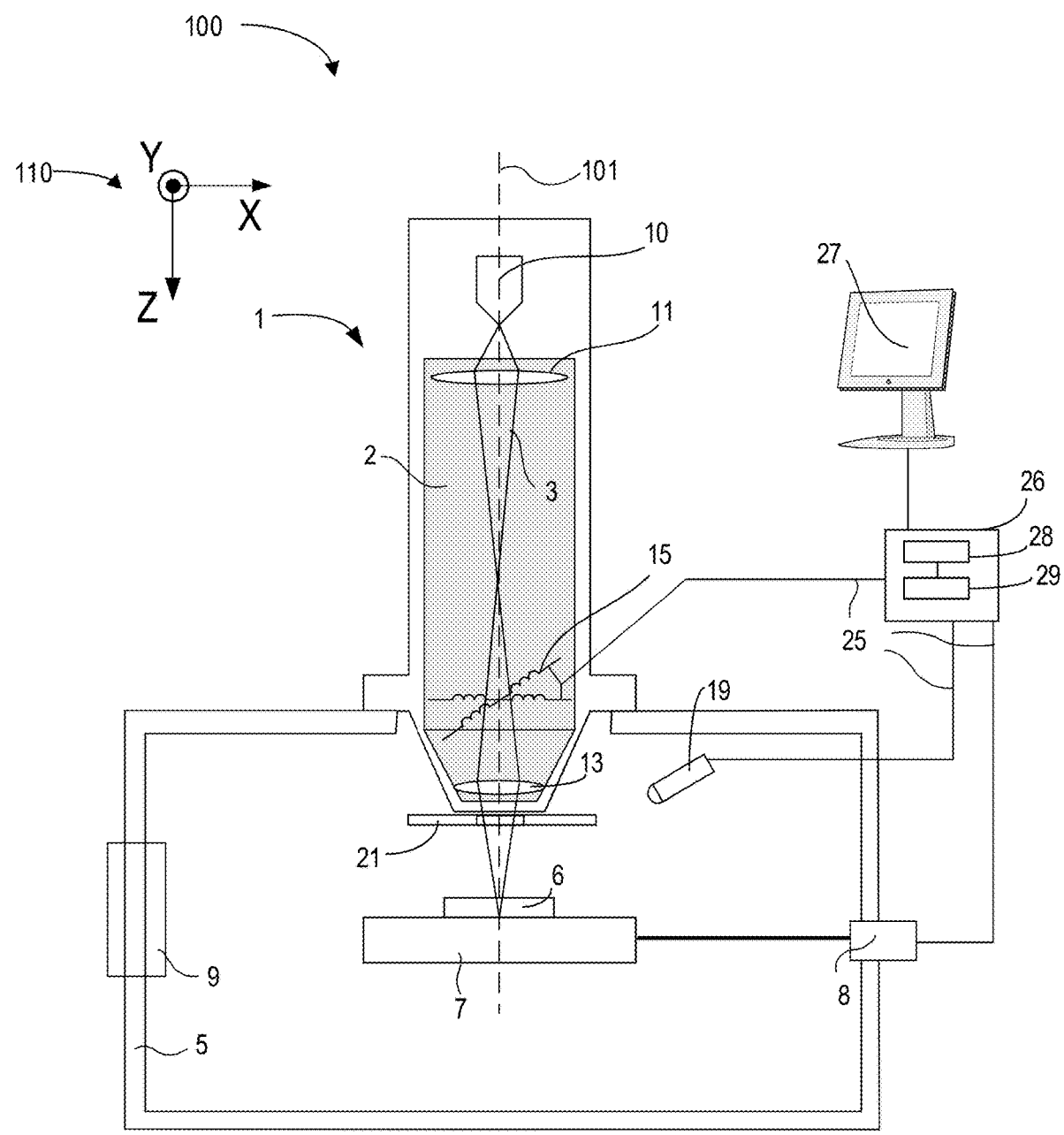
FIG. 1 shows a charged particle microscope.

The following description relates to methods and systems for determining sample composition based on spectral data, such as energy spectra acquired by detecting emissions responsive to irradiating the sample with a charged particle beam. In U.S. patent U.S. Pat. No. 9,048,067, Owen discloses a method of identifying mineral by sequentially decomposing spectral data into elements from mineral definitions. The decomposition determines the proportion of chemical elements in the unknown mineral by fitting the known elemental spectra of an element list against the detected X-ray spectrum, wherein the element list is obtained by selecting mineral definitions in a mineral database. Applicant recognizes that accurate compositional analysis requires accurate element list. The element list may be inaccurate when the acquired X-ray spectrum of unknown sample is sparse (that is, total number of counts per spectrum is low). In sparse spectrum, it is hard to locate peak accurately or distinguish peaks that are close or interfering with each other. Increasing the number of x-ray counts (therefore having denser spectrum) can improve the elemental identification accuracy. However, it may also significantly increase the total data acquisition time. Moreover, because the detected X-ray spectrum of the same mineral may be different for different microscopes due to factors including detector aging and different operating conditions, the known elemental spectra may not fit the detected X-ray spectrum properly.

In order to address the above issues, a trained neural network (NN) adapted to system operating conditions of a specific microscope is used to perform elemental analysis. In one example, after loading a first sample into a microscope, a charged particle beam irradiates one or more locations of the first sample. A first type emission, such as an X-ray, from each location is acquired in the form of energy spectra, wherein each energy spectrum corresponds to one sample location. A trained NN receives each of the acquired energy spectrum as input and outputs chemical elements identified in the spectrum and a probability of each identified chemical element. After processing the acquired energy spectra, a list of first chemical elements included in the first sample can be generated. A second type emission from the sample may be simultaneously or separately detected from one or more locations of the sample. A sample image may be generated based on the detected second type emission. The sample image shows structure of the sample. The sample image may be an optical image, scanning electron microscopy (SEM) image, backscattered electron (BSE) image, or transmission electron microscopy (TEM) image. In some examples, the sample image also includes chemical elemental information determined from the trained NN. One or more pixels are selected in the sample image. Chemical elements corresponding to the selected pixels are displayed. In some examples, the first sample is a reference sample with known elemental composition. If the displayed chemical elements do not match the known elemental composition at the corresponding sample locations, the trained NN is retrained with the spectra corresponding to the selected pixels. The retrained NN is then used for elemental analysis of spectral data acquired from the microscope from another sample. In this way, the retrained NN is adapted to microscope-specific parameters and operating conditions. For example, the retrained NN can be adapted to detector induced energy shifts in the spectral data. Further, the retrained NN is adapted to specific use case. For example, through the retraining, NN is adapted to distinguish interfering peaks characteristic to certain mineral, so that chemical elements may be more accurately identified.

In another example, after loading a first sample into a microscope, a charged particle beam, such as an electron beam, irradiates one or more locations of a sample. A first type emission, such as an X-ray, from each location is detected and used to form of energy spectra. A second type emission, such as scattered electrons, is detected simultaneously or separately from the first type emission. A sample image is generated based on the second type emission. One or more pixels are selected, such as by an operator, from the sample image. In one example, one or more spectra corresponding to the selected pixels are selected from the energy spectra formed based on the first type emission. In another example, sample regions corresponding to the selected pixels are irradiated by the charged particle beam, and the spectra corresponding to the selected pixels are recollected. The recollected spectra may be denser than the first spectra. Chemical elements corresponding to the selected pixels are identified by processing the selected spectra or the recollected spectra using a trained NN. If the identified chemical elements are different from a known elemental composition at the selected sample region, the trained NN is retrained with the selected spectra and the known composition.

In another example, a sample image, showing structure of the sample, is displayed to the operator. The sample image may be any one of the optical, SEM, BSE or TEM image. One or more pixels in the sample image are selected automatically or by an operator. Sample regions corresponding to the selected pixels are then irradiated by the charged particle beam, and spectral data are collected by detecting a first type of emission, such as an X-ray. Chemical elements corresponding to the selected pixels are identified by processing the collected spectral data using a trained NN. If the identified chemical elements are different from a known elemental composition at the selected sample region, the trained NN is retrained with the spectral data and the known composition.

The retrained NN may be stored, such as in a non-transitory memory of the microscope from which the spectral data for retraining are acquired, for processing the spectral data acquired by the microscope. The retrained NN may replace the trained NN for future elemental analysis. In some examples, the trained NN and the retrained NN are both stored in a library. The NNs in the library may serve as a baseline trained NN for further retraining in the same or different microscope. The microscope may irradiate one or more locations of a second sample with the charged particle beam and acquire an energy spectrum from each of the sample locations. The retrained NN processes each of the acquired spectrum and outputs chemical elements and corresponding probability. Chemical elements with a probability higher than a threshold probability may be identified as second chemical elements of the second sample. Compositional map may be generated based on the second chemical elements. The compositional map shows spatial distribution of chemical element or component in the sample. In one example, the compositional map is an elemental map showing spatial distribution of second chemical elements. In another example, the acquired spectra of the sample are further decomposed into multiple spectral components and/or abundances based on the second chemical elements. Each component may correspond to a chemical element, a mixture of chemical elements, or a chemical phase. Each component corresponds to one spectral component and an abundance. The spectral component may be the spectrum of the component. The abundance may be the amount of the component. In on example, the abundance is the ratio of the component at a sample location. The compositional map may show spatial distribution of components in the sample.

In some examples, a first spectra of multiple first locations of the sample may be acquired by scanning the sample with the charged particle beam. Chemical elements of the sample are identified based on the first spectra using the trained NN. The first spectra may then be decomposed into various components based on the identified chemical elements. Additionally, or alternatively, the abundance of each component may be determined through the decomposition process. In some example, after identifying chemical elements in the sample, a second spectra of multiple second locations of the sample are acquired by scanning the sample with the charged particle beam. The first spectra may be denser than the second spectra. That is, the number of counts is higher for each of the first spectrum than each of the second spectrum. Alternatively, the second sample locations may be different from the first sample locations. For example, the second sample locations cover larger area and/or have higher spatial resolution than the first sample locations. The second spectra can be decomposed based on the identified chemical elements to generate a compositional map.

In some examples, after identifying the chemical elements of the reference sample with the trained NN, the identified chemical elements are displayed to an operator or user, for example, in a periodic table. The operator may input the known composition/chemical elements of the reference sample to the microscope for retraining the trained NN. In another example, a sample image is displayed simultaneously with the identified chemical elements. The sample image may show structure of the reference sample. Alternatively or additionally, the sample image may show the spatial distribution of the identified chemical elements in the reference sample. The sample image may include all scanned sample locations or a subset of sample locations. The operator may select one or more regions in the sample image and retrain the NN with integrated spectrum and known elemental composition of the selected region. The region may be a line, an area, or a point in the sample image. In yet another example, an integrated spectrum is displayed together with the sample image and the identified chemical elements, for example, in the same window. The integrated spectrum is the sum of all spectra in the selected region. By selecting a region of the sample and displaying the integrated spectrum, the operator can choose a region that can accurately reflect the known elemental composition. For example, the operator may choose a region without abrupt change in chemical element distribution, or a region excluding sample boundaries. In another example, the operator may choose a region with overlapping peaks, and retrain the NN to better identify or differentiate the peaks.

In some examples, the trained NN may be automatically retrained with known elemental composition of a reference sample after acquiring spectral data from the reference sample. Instead of the operator selecting regions in the sample image, regions in the sample image are automatically selected. The trained NN may then be retrained based on the spectral data from the selected regions. In some examples, a sample image showing sample structure may be displayed to the operator. The operator may select the locations for collecting the spectral data in the sample image. The sample image may be optical image, SEM image, BSE image, or TEM image.

In some examples, the trained NN is generated by training a naïve NN with training data including simulated and/or experimental data. The simulated training data may be generated based on multiple chemical elements and their known spectra. The simulated training data may include individual chemical elements and its spectrum, as well as a combination of chemical elements and corresponding combined spectrum. For example, the combination of chemical elements are elements in a mineral and the combined spectrum is the spectrum of the mineral. The experimental data may be generated by imaging references samples with known composition using one or more microscopes. Different trained NNs may be generated for different microscopy operating conditions. The operating conditions may include one or more of accelerating voltage, beam current, take-off angle, working distance and detector setting (such as bias voltage).

The NN may be trained off-line to identify many, such as 100, chemical elements or combinations of chemical elements. However, the trained NN may not be sensitive to a particular combination of chemical elements, especially when the peaks of individual chemical elements interfering with each other. Retraining the trained NN can adjust or adapt the NN to be more sensitive to, therefore more accurate to identify, a specific type of materials/minerals that are of interested by the operator.

In some examples, the charged particle beam includes electron beam and ion beam. The energy spectrum includes X-ray spectrum and electron energy loss spectrum. In other examples, the chemical elemental analysis may be applied to analyzing other type of spectral data, such as Raman spectra.

Turning to FIG. 1, FIG. 1 is a highly schematic depiction of an embodiment of a charged particle microscope (CPM) in which the present invention is implemented; more specifically, it shows an embodiment of a scanning electron microscopy (SEM) system. System axes are shown as axes 110. Microscope 100 comprises a particle-optical column 1, which produces a beam 3 of charged particles (in this case, an electron beam) that propagates along a particle-optical axis 101. Particle-optical axis 101 may be aligned with the Z axis of the system. The column 1 is mounted on a vacuum chamber 5, which comprises a sample holder 7 and associated actuator(s) 8 for holding/positioning a sample 6. The vacuum chamber 5 is evacuated using vacuum pumps (not depicted). Also depicted is a vacuum port 9, which may be opened to introduce/remove items (components, samples) to/from the interior of vacuum chamber 5. Microscope 100 may comprise a plurality of such ports 9, if desired.

The column 1 (in the present case) comprises an electron source 10 and an illuminator 2. This illuminator 2 comprises lenses 11 and 13 to focus the electron beam 3 onto the sample 6, and a deflection unit 15 (to perform beam steering/scanning of the beam 3). The microscope 100 further comprises a controller/computer processing apparatus 26 for controlling inter alia the deflection unit 15, lenses 11, 13 and detectors 19, 21, and displaying information gathered from the detectors 19, 21 on a display unit 27. The display unit may also serve as an input unit for receiving operator inputs.

The detectors 19 and 21 are chosen from a variety of possible detector types that can be used to examine different types of "stimulated" radiation emanating from the sample 6 in response to irradiation by the (impinging) beam 3. Detector 19 may be a solid state detector (such as a photodiode) that is used to detect cathodoluminescence emanating from the sample 6. It could alternatively be an X-ray detector, such as Silicon Drift Detector (SDD) or Silicon Lithium (Si(Li)) detector, for example. Detector 21 may be an electron detector in the form of a Solid State Photomultiplier (SSPM) or evacuated Photomultiplier Tube (PMT) for example. This can be used to detect backscattered and/or secondary electrons emanating from the sample 6. The skilled artisan will understand that many different types of detector can be chosen in a set-up such as that depicted, including, for example, an annular/segmented detector. By scanning the beam 3 over the sample 6, stimulated radiation—comprising, for example, X-rays, infrared/visible/ultraviolet light, secondary electrons (SEs) and/or backscattered electrons (BSEs)—emanates from the sample 6. Since such stimulated radiation is position-sensitive (due to said scanning motion), the information obtained from the detectors 19 and 21 will also be position-dependent. This fact allows (for instance) the signal from detector 21 to be used to produce a BSE image of (part of) the sample 6, which image is basically a map of said signal as a function of scan-path position on the sample 6.

The signals from the detectors 19 and 21 pass along control lines (buses) 25, are processed by the controller 26, and displayed on display unit 27. Such processing may include operations such as combining, integrating, subtracting, false coloring, edge enhancing, and other processing known to the skilled artisan. In addition, automated recognition processes (e.g. as used for particle analysis) may be included in such processing. The controller includes a processor 28 and a non-transitory memory 29 for storing computer readable instructions. Methods disclosed herein may be implemented by executing the computer readable instructions stored in the non-transitory memory 29 in the processor 28.

It should be noted that many refinements and alternatives of such a setup will be known to the skilled artisan, such as the use of a controlled environment within (a relatively large volume of) the microscope 100, e.g. maintaining a background pressure of several mbar (as used in an Environmental SEM or low-pressure SEM).

Figure 2:
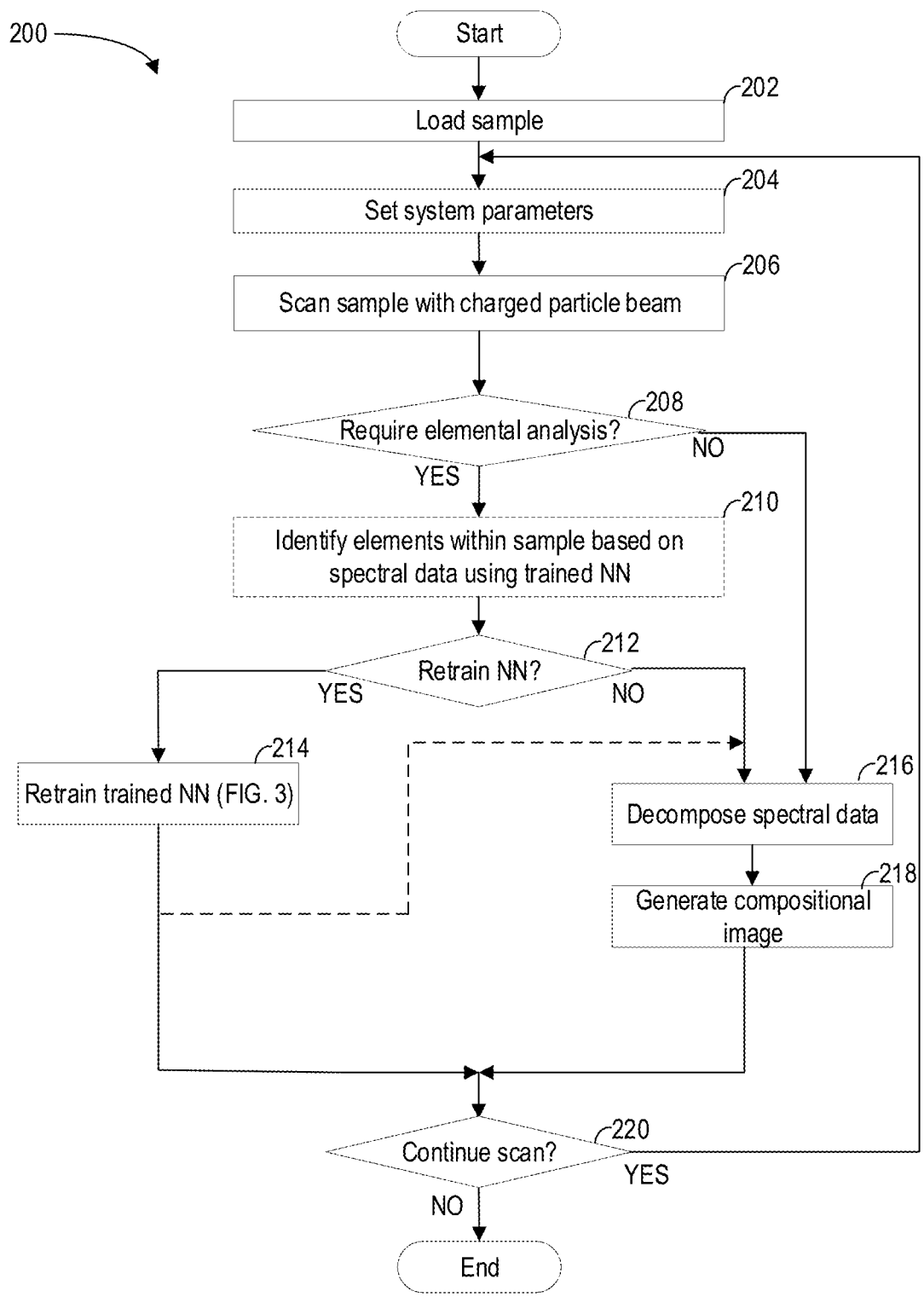
FIG. 2 is a flowchart of an example method for determining sample composition from spectral data.

FIG. 2 shows method 200 for extracting sample composition from spectral data. In one example, the spectral data may be EDS spectra acquired using microscope 100 of FIG. 1. A trained NN performed elemental analysis to identify chemical elements in the sample. The trained NN may be adapted to microscope 100 and specific sample types by retraining (or updating) the trained NN with measurements from a sample with known elemental composition.

At 202, the sample is loaded into the microscope. At 204, the system parameters are set. The system parameters include operating conditions such as one or more of accelerating voltage, beam current, working distance and detector setting. The detector setting may include integration time at each sample location. The system parameters may also include scan parameters such as the scan path and scan region.

In some examples, a sample image showing structure or dimension of the sample may be displayed to the operator. The sample image may be an EM image. The operator may select a scan region in the sample image. The operator may also move the sample relative to the charged particle beam to move sample into the current field of view (FOV) to facilitate selecting the scan region.

At 206, one or more locations of the sample are scanned with the charged particle beam. The scanned sample locations are determined at 204. At each sample location, one or more types of charged particles emitted from sample are acquired with one or more detectors. The acquired charged particles may include elections and X-rays. An energy spectrum, such as X-ray spectrum, is obtained for each sample location. The acquired charged particles may also include backscattered electrons or secondary electrons.

At 208, method 200 determines whether elemental analysis on the spectral data acquired at 206 needs to be performed. In one example, the elemental analysis is required if the current sample is a reference sample for retraining the trained NN. In another example, the elemental analysis is not required if the elemental analysis has been performed on the sample before. In yet another example, the elemental analysis is not required if the elemental composition of the sample is known, such as when the trained NN has been retrained with a reference sample with similar composition as the current sample. If elemental analysis is not required, method 200 moves to 216 and decompose spectral data based on the known elemental composition. If the elemental analysis is required, method 200 moves to 210 to perform elemental analysis on the spectral data.

At 210, chemical elements within the sample are optionally identified with a trained NN. The trained NN may be selected from a group of trained NNs, such as baseline NNs, based on the operating conditions set at 204. The trained NN may be a convolutional NN or a network for natural language processing. The trained NN analyzes one or more of the acquired spectra and, for each spectrum, outputs a list of chemical elements and corresponding probabilities. Identified chemical elements at a particular sample location are the chemical elements with a probability equal or higher than a threshold probability. For example, the threshold probability is 0.75. In some examples, the threshold is any number between 0 and 1, including 1. In some examples, the elemental analysis may be performed on a subset of acquired spectra.

Figure 3:
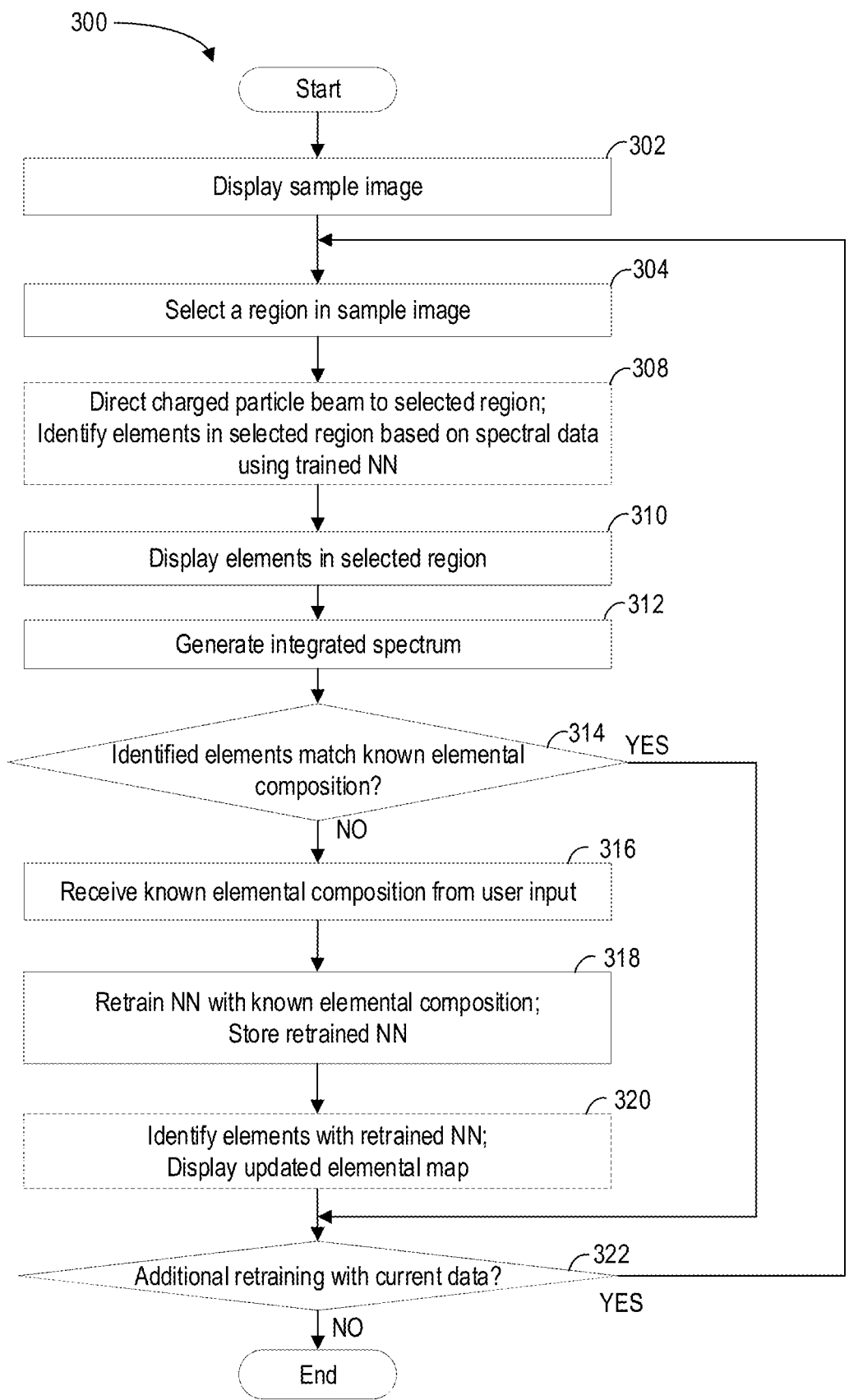
FIG. 3 is a flowchart of an example method for retraining a trained neural network for elemental analysis.

At 212, method 200 determines whether the NN requires retraining. Retraining may be required if the trained NN has not been retrained with spectral data acquired from the current microscope. Retraining may not be required when the trained NN has been retrained with spectral data acquired from the microscope with a reference sample of similar composition. If retraining is not required, method 200 proceeds to 216. If retraining is required, method 200 proceeds to 214 to retrain the trained NN. Details of the retraining process are shown in FIG. 3.

After retraining the trained NN at 214, the retrained NN may be saved. The retrained NN may be used for analyzing sample with similar composition or spectral data acquired under similar operating conditions. In some examples, the spectral data used for retraining the trained NN may be further decomposed at 216.

At 216, the spectral data acquired at 206 are decomposed based on the elemental information. The elemental information may be known or pre-determined and loaded into the controller based on the sample type. Alternatively, the elemental information may be the identified chemical elements at 210. In one example, each of the acquired spectrum is decomposed into one or more spectral components and/or an abundance of each component. Each component corresponds to one spectral component and one abundance. Each component may be an element, a mixture of elements, or a chemical phase. The components may include various combinations of the known or identified elements. One way of decomposing the spectral data is shown in U.S. application Ser. No. 17/166,885, by Petr Hlavenka et al., filed on Feb. 3, 2021, and is herein incorporated by reference in its entirety.

At 218, one or more compositional images are generated. The compositional images include the elemental map showing distribution of identified chemical elements in the sample. The compositional images also include images generated based on the spectral components and/or abundance obtained at 216. In the compositional image, the compositional data may be overlaid onto a structural image of the sample. The structural image can be generated based on scattered charged particles, such as scattered electrons, acquired at 206.

At 220, method 200 determines whether additional scan of the sample is needed. Additional scan may be needed to acquire more spectral data for retraining. In some examples, in a first scan, multiple first sample locations may be scanned for determining the elemental composition and/or retraining the trained NN. The sample may be rescanned in a second scan, wherein multiple second sample locations may be scanned for generating the compositional image. The system parameters in the second scan may be different from the first scan. In one example, the second scan may have a higher spatial resolution than the first scan. In another example, the multiple first sample locations may be different from the second sample locations. The number of sample locations in the second scan may be greater than the number of sample locations in the first scan. In yet another example, the number of counts of each spectrum for the second scan may be less than the first scan. If additional scan is needed, method 200 proceeds to 204 to reset the system parameters. Otherwise, method 200 ends.

In this way, elemental analysis is performed with a trained NN. The trained NN may be retrained specifically for the microscope, operating conditions and sample types based on measurement of one or more reference samples with known elemental composition using the microscope. Once the NN is retrained, it may be stored and used for elemental analysis of other similar samples. Based on the identified chemical elements from the elemental analysis, the spectral data can be decomposed to obtain the spectral components and the abundance at each sample location, which can be used to generate additional compositional images to provide more insights of sample composition.

FIG. 3 shows method 300 for retraining the trained NN. The trained NN may be retrained with an integrated spectrum generated from acquired spectral data, and the known elemental composition corresponding to the integrated spectrum. Method 300 may interact with the operator with a user interface to receive the known elements.

At 302, a sample image showing sample structure is displayed. The sample image may be generated based on scattered electrons acquired during the scan at 206 of FIG. 2. Alternatively, the sample image is acquired separately from the scan at 206 of FIG. 2. The sample image may be an optical image, a SEM image, a BSE image, or a TEM image. In one example, the sample image may be an elemental map showing spatial distribution of the identified chemical elements in the sample, if elemental analysis is performed in 210 of FIG. 2. The elemental map may be generated based on both the acquired spatially resolved scattered electrons and the identified chemical elements. For example, signals from scattered elections are displayed in grayscale to show structural information of the sample. The identified elements may be color-coded and overlay onto the grayscale image.

In some examples, chemical elements identified at 210 of FIG. 2 are displayed together with the sample image. In one example, the identified chemical elements may be displayed in a periodic table. In another example, the identified chemical elements are displayed as a list.

At 304, one or more regions in the sample image are selected. The regions may be selected by the operator after observing the elemental map. The regions may alternatively be selected automatically. For example, a center region of the sample is automatically selected. The selected region contains one or more pixels of the sample image. In one example, the selected region may be an area reflecting the known composition of the sample. In another example, the selected region corresponding to characteristic spectrum, such as spectrum with overlapping peaks.

At 308, the charged particle beam is optionally directed to sample regions corresponding to the selected region (or pixels) in the sample image for collecting additional spectral data, and the additional spectral data are analyzed using the trained NN to identify chemical elements in the selected region(s). The system parameters may be adjusted for collecting the additional spectral data. In one example, the integration time of the detector is longer comparing to the integration time at 206, so that denser spectra are acquired. In another example, the scan step is adjusted.

At 310, chemical elements identified in the selected region are displayed at 310. The chemical elements may be identified at either 210 or 310. In one example, the chemical elements are displayed by updating the displayed identified chemical elements at 306. In one example, the identified chemical elements at 310 may be displayed in a periodic table or as a list. One or more of the integrated spectra, identified chemical elements, and sample image may be selectively displayed individually or together on a display unit.

At 312, an integrated spectrum is generated based on acquired spectra within the selected regions. For example, one or more spectra acquired from sample locations within the selected regions are summed or averaged to generate the integrated spectrum. In some examples, the integrated spectrum is displayed to the operator.

At 314, identified chemical elements in the selected regions are compared with the known elemental composition in the selected regions. The comparison may be executed by the controller of the microscope or by the operator. If the identified chemical elements and the known elements do not match, method 300 proceeds to 316 to receive the known elemental composition from user input. Otherwise, method 300 proceeds to 322.

At 316, known elemental compositions from the selected regions are received by user input. For example, the operator can select or deselect the displayed chemical elements at 310.

At 318, the trained NN is retrained with the integrated spectrum and the received known composition information. In some examples, the retrained NN may be verified with spectra data not used for retraining the NN. In one example, the trained NN is replaced by the retrained NN and stored. In some examples, one or more retrained NNs are stored as baseline NNs. The baseline NN may be used as a starting point for retraining, for example, for different sample or different microscopy system.

At 320, the acquired spectral data may optionally be reprocessed with the retrained NN to generate an updated elemental map. The updated elemental map may be used for evaluating the accuracy of the retrained NN.

At 322, method 300 checks whether additional retraining of the NN with the current spectral data is needed. For example, an operator may determine whether or not to retrain the NN based on the updated elemental map. If retraining is needed, method 300 moves to 306, and the NN may be retrained with spectral data from different regions of the sample. If no additional retraining is needed or if additional spectra data need to be required for retraining, method 300 ends.

By receiving chemical elements selected the operator, new training data that has not been used for off-line training the NN may be obtained to fine-tune the NN to be more sensitive to specific user case and/or specific composition of interest.

Figure 4:
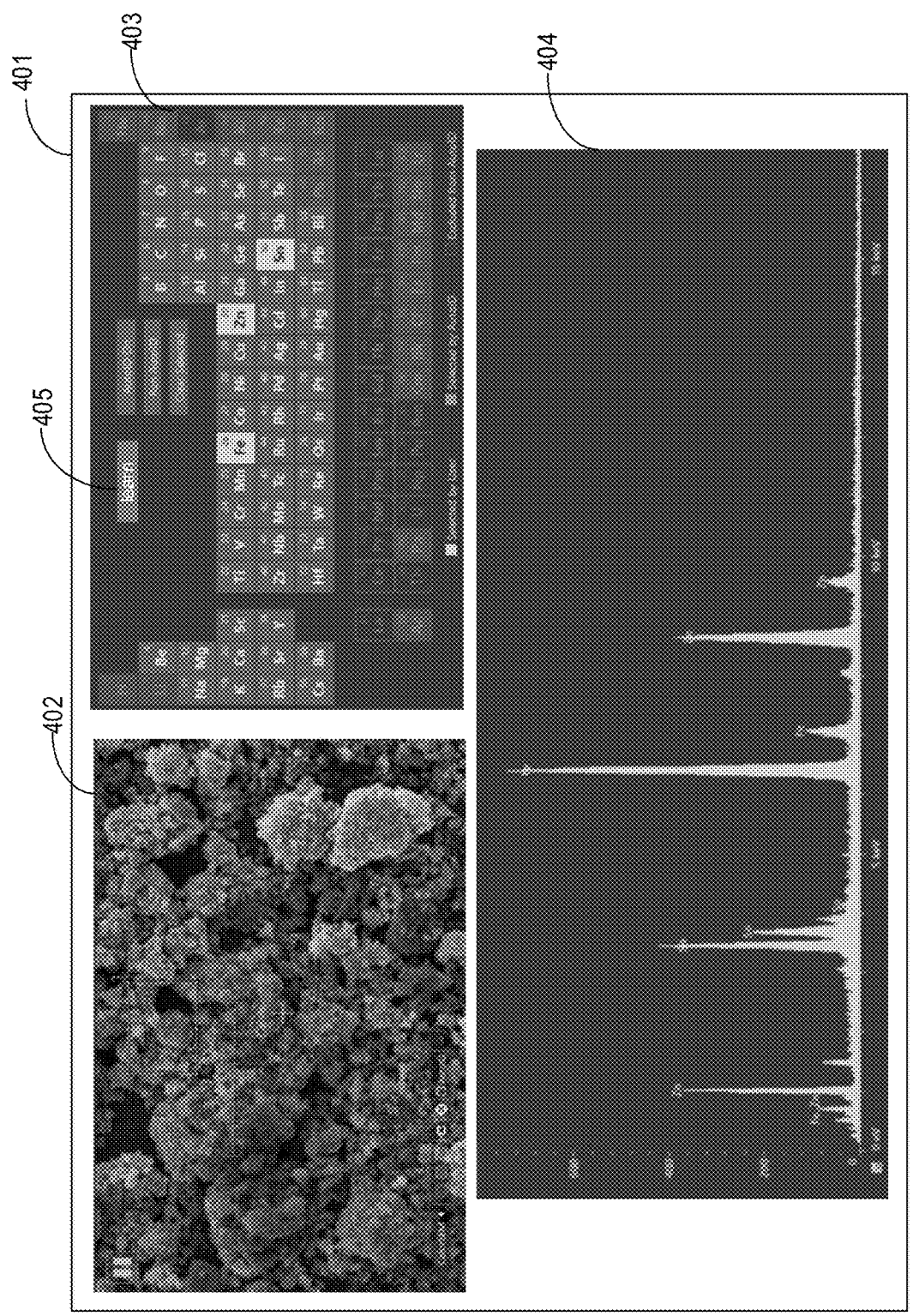
FIG. 4 shows an example user interface for displaying elemental analysis result and retraining the trained neural network.

FIG. 4 shows an example of user interface for displaying the results from elemental analysis and receiving user inputs for retraining the trained NN. The elemental map 402, the periodic table 403 showing identified chemical elements, and the integrated spectrum 404 are simultaneously displayed in a window 401 on a display unit. The elemental map shows identified elements color-coded and overlaid on an electron microscopic image of the sample. The identified elements Fe, Zn, and Sn are highlighted in the periodic table. The integrated spectrum 404 may be generated based on all spectral data received in the sample region shown in the elemental map 402. Peaks in the integrated spectrum that correspond to the identified elements may be indicated in the integrated spectrum.

An operator may select one or more regions in elemental map 402. The region may be a line, an area, or a point in the sample image. During or after the selection, the periodic table 402 and integrated spectrum 404 are updated with identified elements and updated integrated spectrum of the selected regions. If the identified elements are different from the known elemental composition, the operator may input the known elemental composition by selecting and/or deselecting elements in the periodic table 403. The operator may then click the "learn" button 405 in the window to retrain the NN with the inputted information.

Figure 5:
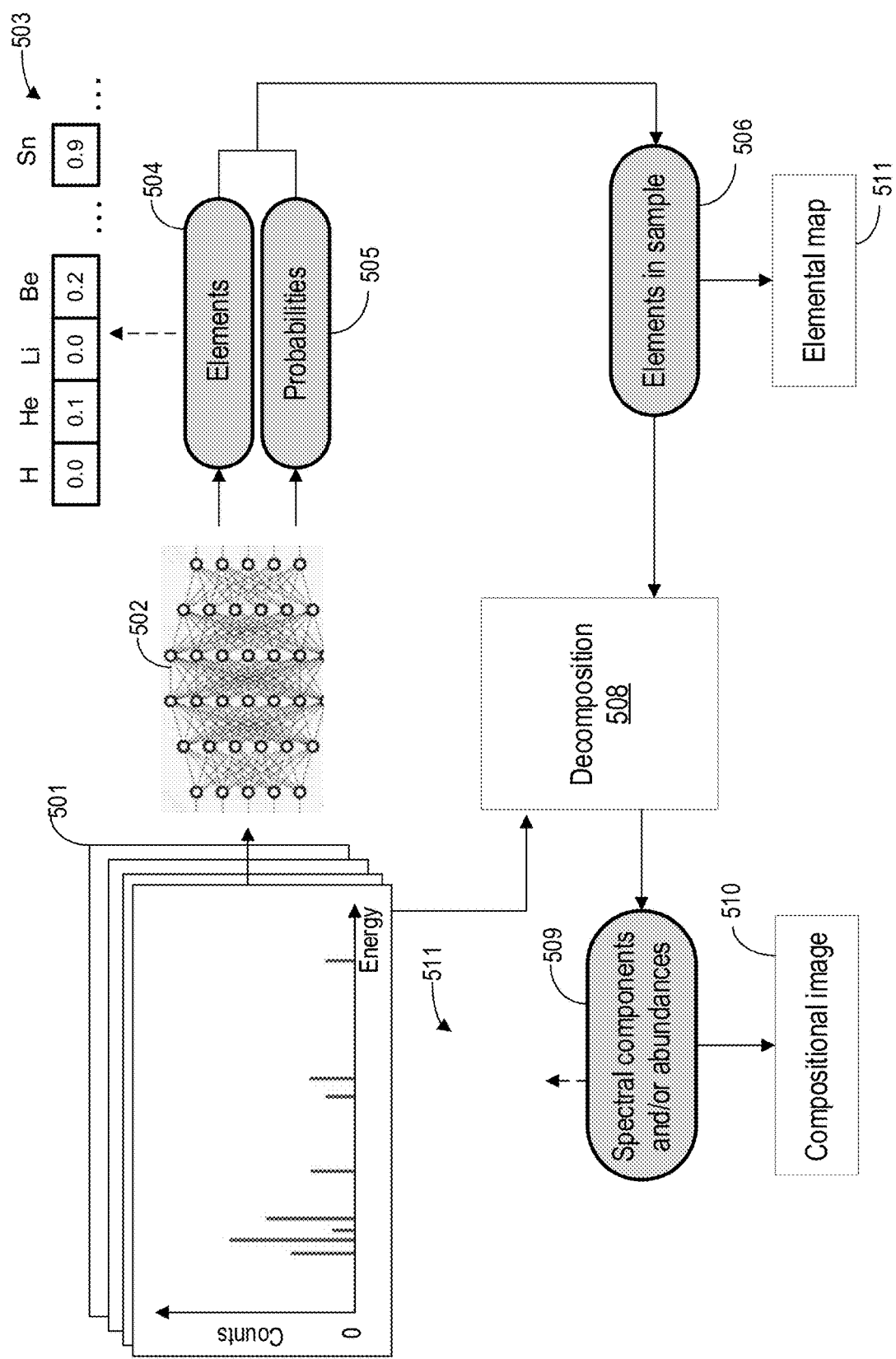
FIG. 5 illustrates an example dataflow of the method in FIG. 2.

FIG. 5 illustrates an example data flow for extracting sample composition from spectral data with a trained NN. The acquired spectra 501 are processed by trained NN 502. The trained NN generates a list of chemical elements 504 and the probability 505 for each chemical element for each processed spectrum. An example list of chemical elements and probabilities are shown in 503. The list may contain all chemical elements in the periodic table. The value of probabilities ranges from 0 to 1. The chemical elements 506 in sample contain all chemical elements that identified from the spectra 501. For example, chemical elements 506 includes chemical elements 504 that have a probability greater than a threshold probability. Each spectrum of spectra 501 may then be decomposed at 508 into spectral components and/or abundances based on the identified chemical elements 506. An example of components and abundances at one sample location is shown in 511. In this example, there are two components at the sample location. Each component is a combination of individual chemical elements. The first component contains Fe at concentration 0.4 and oxygen at concentration 0.6 and the second component contains Si at 0.33 and oxygen 0 at 0.66. Each component with an abundance 0.5. That is, the composition at the sample location is half first component and half second component. Elemental map 511 can be generated based on the identified chemical elements 506 at each sample location. Compositional image 510 can be generated based on the spectral components and/or abundances of scanned sample locations.

Figure 6:
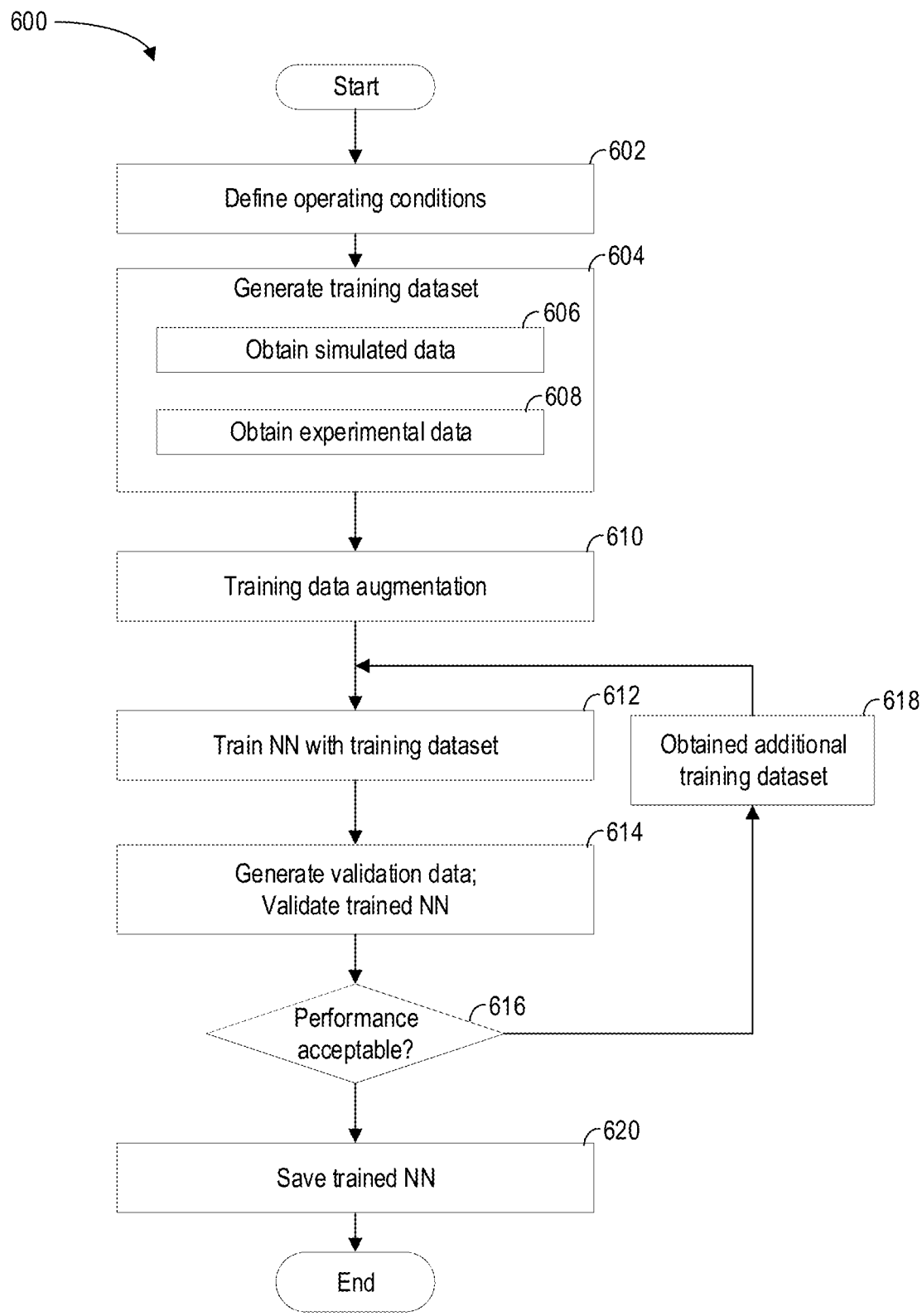
FIG. 6 is a flowchart of an example method for generating a trained neural network for elemental analysis.

FIG. 6 shows method 600 for generating a trained NN off-line. The trained NN may then be retrained on-line as shown in method 200 of FIG. 2.

At 602, various operating conditions are defined. The operating conditions may include one or more of accelerating voltage, beam current, working distance and detector setting. A trained NN may be generated for each operating condition.

At 604, the training dataset are determined based on the operating conditions. The training dataset includes training spectra and corresponding elemental composition. The training spectra may include simulated data 606 and/or experimental data 608 acquired from one or more microscopes. The training spectra may include characteristic spectrum of a single chemical element and/or spectrum of combined chemical elements.

At 610, the training data are augmented by introducing noise, nonlinearities, and adjusted gains. In one example, the noise may be introduced to the training data by shifting one or more peaks within a specific energy range of the peak location. The energy range may be less than 100 eV. In one example, the energy range is less than 50 eV. In another example, noises may be added to the amplitude of the training spectra.

At 612, a naïve NN is trained with the training dataset to generate the trained NN. In some examples, a trained NN is generated for each operating condition defined at 602.

At 614, validation data include validation spectra and corresponding elemental composition are generated, and the trained NN is validated with the validation data. The validation spectra are different from the training spectra. For example, the validation spectra may include experimental spectra acquired from a different microscope. Elemental analysis is performed on the validation spectra with the trained NN. Performance of the trained NN is determined by comparing the elemental composition in the validation data and the identified chemical elements via trained NN.

At 616, if the performance of trained NN is acceptable, the trained NN is saved at 620. Otherwise, additional training dataset is generated at 618 for continuing training the NN.

The technical effect of using a NN for elemental analysis is that the NN can perform elemental analysis on spectral data, especially sparse spectral data, with high speed and accuracy. The technical effect of retraining the trained NN by measuring a reference sample is that the off-line trained NN can adapt to specific use case, system, and material. The technical effect of selecting a region of the reference sample for retraining is that sample regions reflecting the known elemental composition can be selected. The technical effect of performing elemental analysis before decomposing the spectra data is that sample components can be quickly and accurately identified.

In a representation, a non-transitory computer readable media comprises instructions that, when executed by a processor of the controller, causes the controller to: irradiate one or more locations of a first sample with the charged particle beam; acquire one or more first spectra by detecting the first emission from the first sample responsive to the irradiation to the first sample; determine one or more first chemical elements within the first sample by processing the first spectra with a trained neural network stored in the computer readable media; display the one or more first chemical elements; receive a known chemical elemental composition of the first sample, retrain the trained neural network with one or more of the first spectra and the known elemental composition of the first sample; irradiate one or more locations of a second sample with the charged particle beam; acquire one or more second spectra by detecting the first emission from the second sample responsive to the irradiation to the second sample; determine one or more second chemical elements within the second sample by processing the second spectra with the retrained neural network; and generate a compositional map of the second sample based on the second chemical elements.

What is claimed is:

1. A method, comprising:
    irradiating a first sample with a charged particle beam;
    detecting a first type emission from the first sample and forming one or more first spectra from the detected first type emission;
    identifying one or more first chemical elements within the first sample by processing the first spectra with a trained neural network;
    detecting a second type emission from the first sample and displaying a sample image generated based on the detected second type emission;
    selecting one or more pixels in the sample image;
    displaying one or more chemical elements corresponding to the selected pixels;
    responsive to the displayed chemical elements different from a known elemental composition, retraining the trained neural network with spectra corresponding to the selected pixels and the known elemental composition;
    irradiating one or more locations of a second sample with the charged particle beam;
    acquiring one or more second spectra by detecting the first type emission from the second sample; and
    identifying one or more second chemical elements within the second sample by processing the second spectra with the retrained neural network.

2. The method of claim 1, wherein identifying one or more first chemical elements within the first sample by processing the first spectra with a trained neural network comprises:
    inputting one or more of the first spectra into the trained neural network;
    outputting one or more chemical elements and probabilities from the trained neural network, wherein each chemical element corresponds to one probability; and
    selecting the chemical elements with probability greater than a threshold probability as the first chemical elements.

3. The method of claim 1, further comprising generating an elemental map showing a spatial distribution of the second chemical elements in the second sample.

4. The method of claim 1, further comprising decomposing each of the second spectra into one or more spectral components and abundances based on the second chemical elements, wherein each component corresponds to one abundance.

5. The method of claim 4, further comprising generating a compositional map of the second sample based on the spectral components and/or the abundances.

6. The method of claim 5, wherein each spectral component is a spectrum of a component including one or more of the second chemical elements.

7. The method of claim 1, wherein the sample image is displayed based further on the first chemical elements, and wherein the sample image shows a spatial distribution of the first chemical elements.

8. The method of claim 1, further comprising generating the trained neural network by training a neural network with training spectra of multiple chemical elements.

9. The method of claim 8, wherein the training spectra include simulated spectra and/or experimental spectra.

10. The method of claim 1, further comprising receiving the known elemental composition of the first sample via user input.

11. The method of claim 10, wherein retraining the trained neural network with spectra corresponding to the selected pixels and the known elemental composition includes: generating an integrated spectrum from the spectra corresponding to the selected pixels, and retraining the trained neural network with the integrated spectrum and the known elemental composition.

12. The method of claim 11, further comprising displaying the integrated spectrum simultaneously with the one or more chemical elements from the first chemical elements corresponding to the selected pixels.

13. The method of claim 11, wherein displaying the first chemical elements on a display includes displaying the first chemical elements in a periodic table, and wherein the user input includes selecting or deselecting the first chemical elements displayed in the periodic table.

14. The method of claim 1, further comprising:
after selecting one or more pixels in the sample image, directing the charged particle beam to one or more sample regions corresponding to the selected pixels and obtaining one or more spectra of the sample regions; and
identifying the one or more chemical elements corresponding to the selected pixels by processing the obtained spectra with the trained neural network.

15. The charged particle microscopy system of claim 14, wherein the trained neural network receives a spectrum and outputs one or more chemical elements and a probability for each chemical element.

16. The charged particle microscopy system of claim 15, wherein determine one or more first chemical elements within the first sample by processing the first spectra with a trained neural network includes selecting the chemical elements output from the trained neural network with a probability higher than a threshold probability as the first chemical elements.

17. The charged particle microscopy system of claim 14, wherein obtaining one or more spectra corresponding to the selected pixels includes selecting the one or more spectra corresponding to the selected pixels in the first spectra.

18. The charged particle microscopy system of claim 14, wherein obtaining one or more spectra corresponding to the selected pixels includes: directing the charged particle beam to sample regions corresponding to the selected pixels; and acquiring the one or more spectra by detecting the first type emission from the sample regions.

19. A charged particle microscopy system, comprising:
a sample holder for positioning a sample;
a charged particle source for irradiating a charged particle beam towards the sample;
a first detector for detecting a first type emission from the sample responsive to the charged particle beam irradiation;
a second detector for detecting a second type emission from the sample responsive to the charged particle beam irradiation; and
a controller includes a non-transitory computer readable media storing instructions that, when executed by a processor of the controller, causes the controller to:
irradiate a first sample with the charged particle beam;
detect the first type emission from the first sample and form one or more first spectra from the detected first type emission;
detect the second type emission from the first sample and displaying a sample image generated based on the detected second type emission;
receive selection of one or more pixels in the sample image;
obtain one or more spectra corresponding to the selected pixels;
identify one or more first chemical elements within the first sample by processing the obtained spectra with a trained neural network;
responsive to the first chemical elements different from a known elemental composition, retraining the trained neural network with the selected spectra and the known elemental composition; and
save the retrained neural network in the non-transitory computer readable media.

20. The charged particle microscopy system of claim 19, wherein the non-transitory computer readable media includes further instructions that, when executed by the processor of the controller, causes the controller to:
irradiate one or more locations of a second sample with the charged particle beam;
acquire one or more second spectra by detecting the first type emission from the second sample; and
identify one or more second chemical elements within the second sample by processing the second spectra with the retrained neural network.

21. The charged particle microscopy system of claim 20, wherein the non-transitory computer readable media includes further instructions that, when executed by the processor of the controller, causes the controller to: detect the second type emission from the second sample; and generate a compositional map showing a distribution of the second chemical elements in the second sample based on the detected second type emission.

22. The charged particle microscopy system of claim 21, wherein generate a compositional map of the second sample based on the second chemical elements includes: decompose the second spectra into one or more multiple spectral components and an abundance of each spectral component based on the second chemical elements; and generate the compositional map of the second sample based on the spectral components and/or the abundances.

23. The charged particle microscopy system of claim 19, wherein the charged particle beam is an electron beam, the first type emission is an X-ray, and the second type emission is a scattered electron.

24. A non-transitory computer readable media, comprising instructions that, when executed by a processor, causes a computing device to:
access first detector data that correspond to a first type emission from a sample, wherein the first detector data is obtained responsive to irradiation of the sample with a charged particle beam;

cause a display of a sample image generated based on the first detector data;

receive selection of one or more pixels in the sample image;

access second detector data that correspond to a second type emission from one or more sample regions corresponding to the selected pixels, wherein the second detector data is obtained responsive to irradiation of the sample regions with the charged particle beam;

identify one or more chemical elements within the sample by processing the second detector data with a trained neural network;

cause a display of the identified chemical elements;

responsive to the displayed chemical elements different from a known elemental composition, retrain the trained neural network with the second detector data and the known elemental composition; and store the retrained network in the non-transitory computer readable media.

* * * * *